US008138672B2

(12) United States Patent
Lai et al.

(10) Patent No.: US 8,138,672 B2
(45) Date of Patent: Mar. 20, 2012

(54) LAMPS WITH REPLACEABLE COVERS

(75) Inventors: Chih-Ming Lai, Miao-Li Hsien (TW); Yu-Pin Liu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/846,855

(22) Filed: Jul. 30, 2010

(65) Prior Publication Data

US 2011/0031871 A1 Feb. 10, 2011

(30) Foreign Application Priority Data

Aug. 5, 2009 (CN) .......................... 2009 1 0305234

(51) Int. Cl.
*H01L 51/50* (2006.01)

(52) U.S. Cl. ........................................................ 313/512

(58) Field of Classification Search .................. 313/498, 313/512

See application file for complete search history.

(56) References Cited

U.S. PATENT DOCUMENTS

| | | | | |
|---|---|---|---|---|
| 5,655,830 | A | 8/1997 | Ruskouski | |
| 6,227,679 | B1 * | 5/2001 | Zhang et al. | 362/236 |
| 2006/0098440 | A1 | 5/2006 | Allen | |
| 2006/0273340 | A1 * | 12/2006 | Lv | 257/100 |
| 2009/0163056 | A1 * | 6/2009 | Brookins et al. | 439/123 |

FOREIGN PATENT DOCUMENTS

CN 2874242 Y 2/2007

* cited by examiner

*Primary Examiner* — Toan Ton
*Assistant Examiner* — Hana Featherly
(74) *Attorney, Agent, or Firm* — Altis Law Group, Inc.

(57) ABSTRACT

A lamp includes a main body and a removable cover, and the main body includes a lamp housing, a printed circuit board (PCB), at least one light emitting element, and a threaded base. The lamp housing defines a socket configured for receiving the PCB and the at least one light emitting element, and the PCB is electrically connected to the at least one light emitting element and fixed in the socket. The removable cover includes a light-transmission portion and a connection portion, the connection portion connects to the end of the lamp housing with the socket, and the light-transmission portion is opposite to the socket. Light from the at least one light emitting element is emitted from the light-transmission portion.

11 Claims, 10 Drawing Sheets

LAMPS WITH REPLACEABLE COVERS

BACKGROUND

1. Technical Field

The present disclosure relates to lamps with replaceable covers providing different luminosities according to user's need.

2. Description of the Related Art

A commonly used lamp cannot be separated from its cover, and comprises a specific luminosity. When the lamp cover burns out, the whole lamp must be discarded. It wastes dispensable resources. Furthermore, the traditional lamp has a specific luminosity and cannot be replaced with other luminosity because the traditional lamp cover is fixed to the main body of the lamp. It is noted that the lamp cannot be replaced with other lamp covers providing different luminosities according to need.

Therefore, it is desirable to provide a lamp which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present lamp. Moreover, in the drawings, like reference numerals designate corresponding parts throughout the views.

DETAILED DESCRIPTION

Embodiments of a lamp as disclosed are described in detail here with reference to the drawings.

Figure 1:
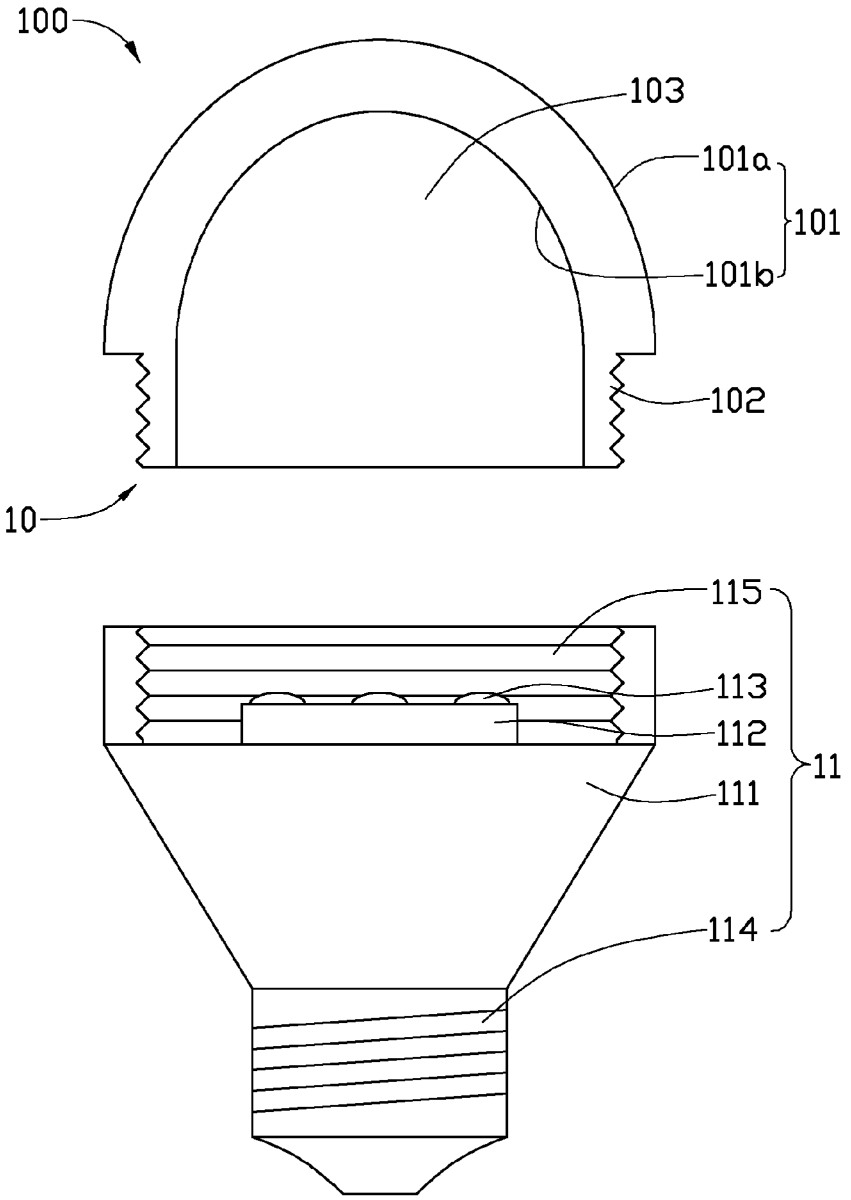
FIG. 1 is a schematic cross-section of a lamp having a first removable cover according to a first embodiment.

Referring to FIG. 1, a lamp 100 according to a first embodiment includes a removable cover 10 and a main body 11.

The main body 11 includes a lamp housing 111, a printed circuit board (PCB) 112, at least one light emitting element 113, and a threaded base 114. The lamp housing 111 defines a socket 115 with a threaded inner surface (not labeled) and configured for receiving the PCB 112 and the at least one light emitting element 113.

The lamp housing 111 is made of a heat conductive material such as metal and is electrically insulated from the threaded base 114 and thermally connected with the PCB 112. The PCB 112 is electrically connected to the at least one light emitting element 113 and fixed on the socket 115. The at least one light emitting element 113 can be, for example, a light emitting diode (LED) chip. Heat generated by the at least one light emitting element 113 can be transmitted to the lamp housing 111.

The removable cover 10 is connected to the lamp housing 111 and configured for enclosing and protecting the at least one light emitting element 113.

The removable cover 10 includes a light-transmission portion 101 and a connection portion 102. The connection portion 102 has a threaded structure engaging the threaded inner surface of the socket 115.

The light-transmission portion 101 transmits light generated by the at least one light emitting element 113 when the connection portion 102 is received in the socket 115.

The removable cover 10 is a transparent body and the removable cover 10 can be resin, epoxy resin, silicone, polymer, polyester or acrylic resin.

The threaded base 114 is connected to the lamp housing 111 opposite to the end of the socket 115. The threaded base 114 is for connection to a lamp socket (not shown) for a standard incandescent bulb or compact fluorescent bulb so that the lamp 100 in accordance with the present invention can be conveniently utilized.

The removable cover 10 is connected to the one end of the socket 115 of the lamp housing 111 with the connection portion 102, providing ease of removal.

The removable cover 10 has a light emitting surface **101*a* and a light incident surface 101*b* having a specific space with the light emitting surface 101*a*. The light emitting surface 101*a* defines a concave portion 103 and the light incident surface 101*b*** is coated with a luminescent layer.

The lamp 100 can emit different kinds of light according to the corresponding removable cover 10 with the different luminescent layers. The removable cover 10 can be hexagonal, cylindrical, bullet-shaped, or other shape.

Figure 2:
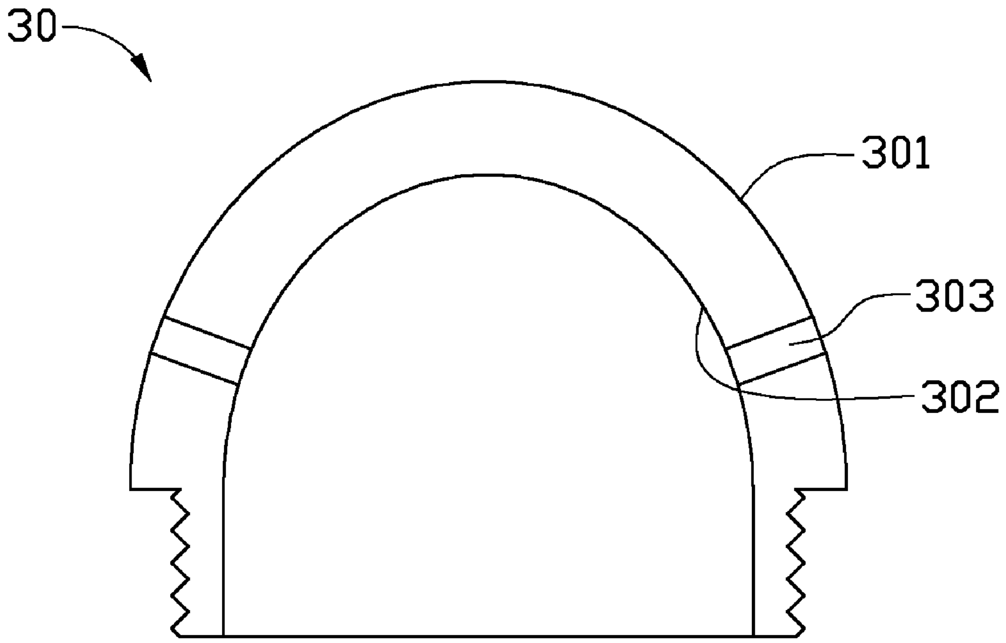
FIG. 2 is a schematic cross-section of a second removable cover of the lamp of FIG. 1.

Referring to FIG. 2, a removable cover 30 includes a light incident surface 302 and a hemispherical light emitting surface 301. The removable cover 30 differs from the removable cover 20 only in its definition of a plurality of through holes 303 passing through the light emitting surface 301 and the light incident surface 302. The plurality of through holes 303 increases air convection and heat dissipation of the lamp 100.

Figure 3:
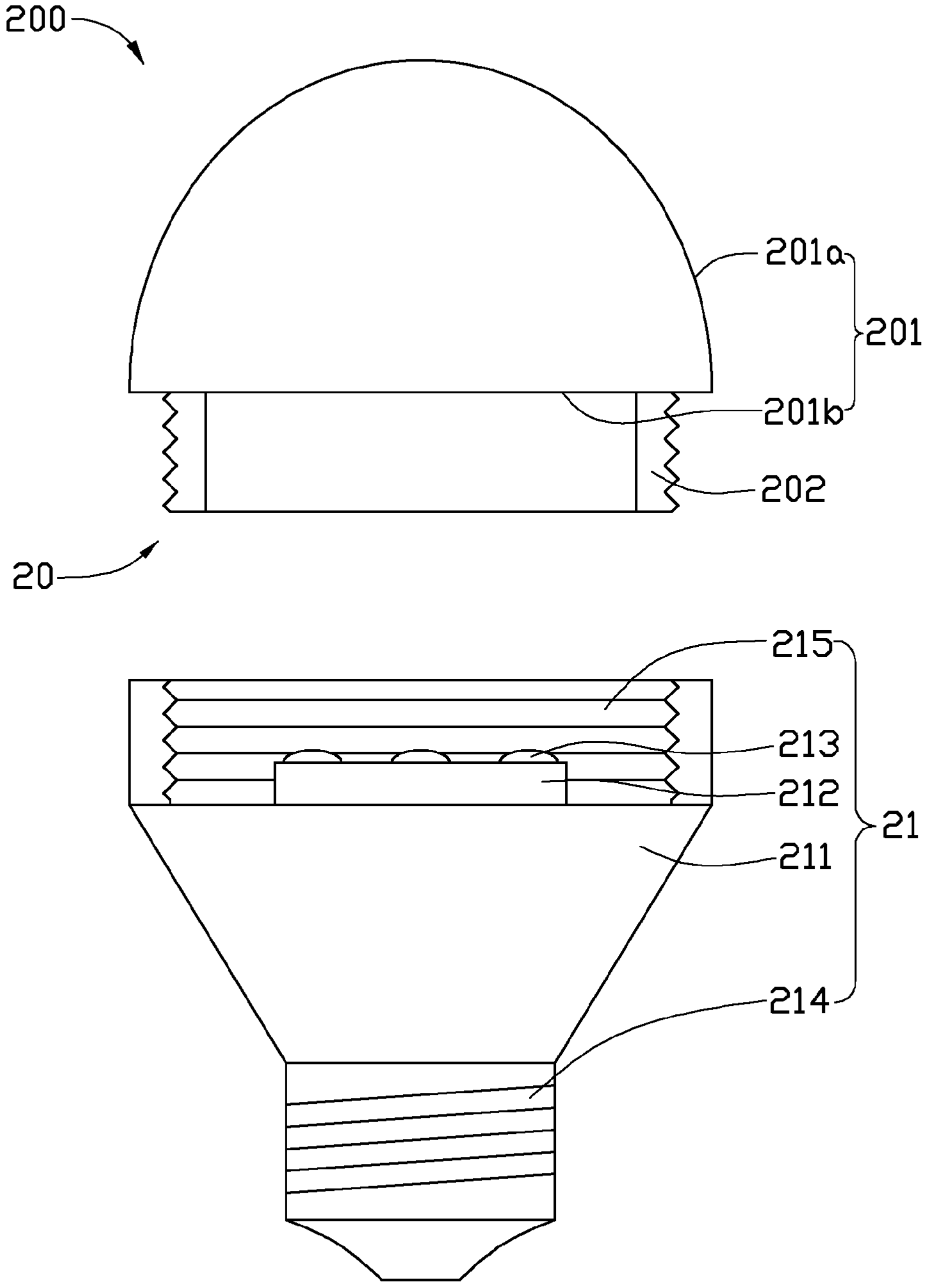
FIG. 3 is a schematic cross-section of a lamp having a first removable cover according to a second embodiment.

As shown in FIG. 3, the lamp 200 in accordance with a second embodiment includes a removable cover 20 and a main body 21. The main body 21 includes a lamp housing 211, a printed circuit board (PCB) 212, at least one light emitting element 213, and a threaded base 214. The lamp housing 211 has a socket 215.

The light emitting element 213 can be a light emitting diode or light emitting diode chip.

The printed circuit board (PCB) 212 is received in the socket 215. The light emitting element 213 is electrically connected to the printed circuit board (PCB) 212. The inside wall of the socket 215 is threaded.

The removable cover 20 includes a light-transmission portion 201 and a connection portion 202. The connection portion 202 engages the threads of the socket 215 of the lamp housing 211. Light from the at least one light emitting element 213 is emitted from the light-transmission portion 201.

The removable cover 20 is a transparent body, and the cover can be resin, epoxy resin, silicone, polymer, polyester, or acrylic resin.

The threaded base 214 is connected to the lamp housing 211 opposite to the end of the socket 215.

In this embodiment, the transparent removable cover 20 has a light emitting surface **201*a*** and a light incident surface 201*b*. The light incident surface 201*b* is a plane parallel to the light emitting element 231 mounting surface of the PCB 212. The light emitting surface 201*a* of the light-transmission portion 201 is connected to the connection portion 202. The light emitting surface 201*a* is coated with a luminescent layer.

Figure 4:
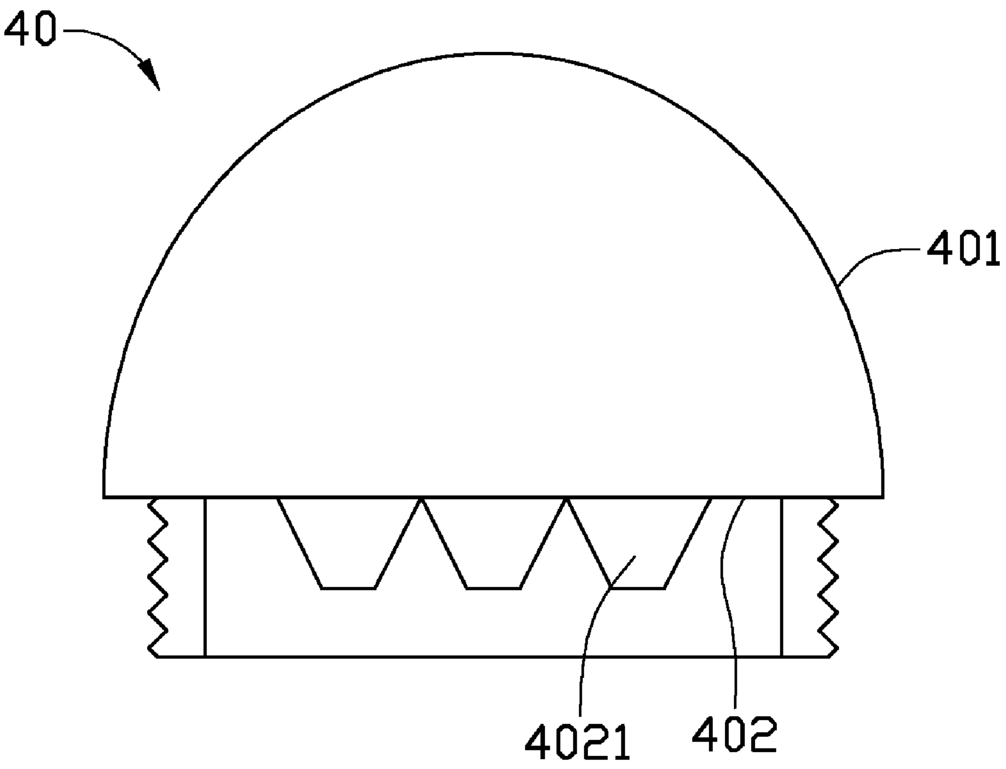
FIG. 4 is a schematic cross-section of a second removable cover of the lamp of FIG. 3.

Referring to FIG. 4, a removable cover 40 includes a light emitting surface 401 and a light incident surface 402. The light emitting surface 401 is non-spherical. The light incident surface 402 includes a plurality of trapezoidal sawtooth protrusions 4021. The trapezoidal sawtooth protrusions 4021 are optically coupled with the corresponding light emitting element 213. The light from the light emitting element 213 passes through the trapezoid sawtooth protrusions 4021 into the removable cover 40, and then is emitted from the light emitting surface 401.

Figure 5:
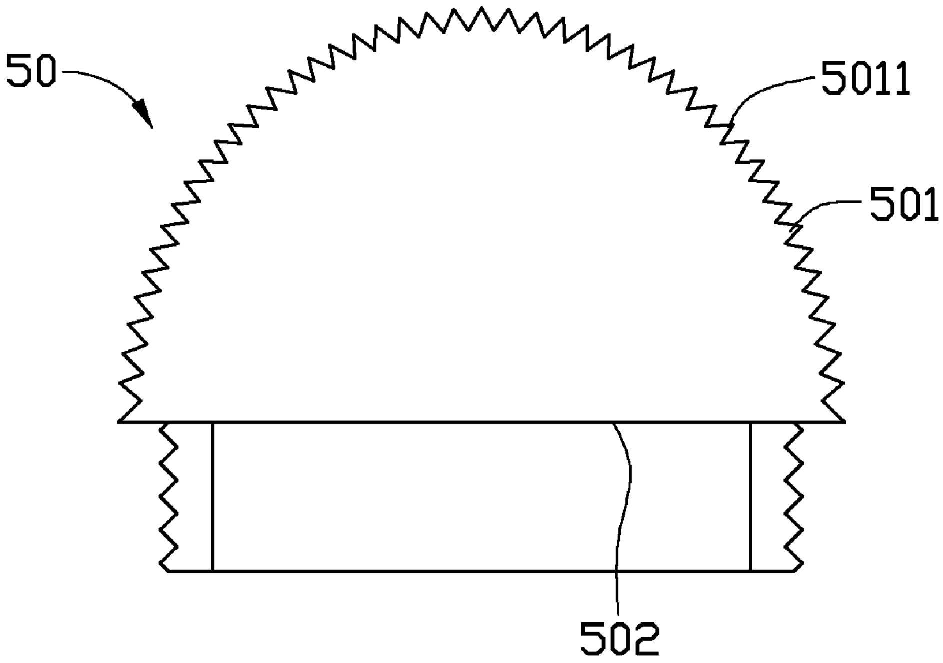
FIG. 5 is a schematic cross-section of a third removable cover of the lamp of FIG. 3.

As shown in FIG. 5, the removable cover 50 includes a light emitting surface 501 and a light incident surface 502. The light emitting surface 501 is non-spherical. A plurality of sawtooth protrusions 5011 are configured on the light emitting surface 501.

The removable cover 50 differs from the removable cover 30 of FIG. 3 only in that the light emitting surface 501 of the removable cover 50 is non-spherical and has sawtooth protrusions 5011. The light transmits from the light emitting surface 501 having sawtooth protrusions 5011 to generate uniform brightness.

Figure 6:
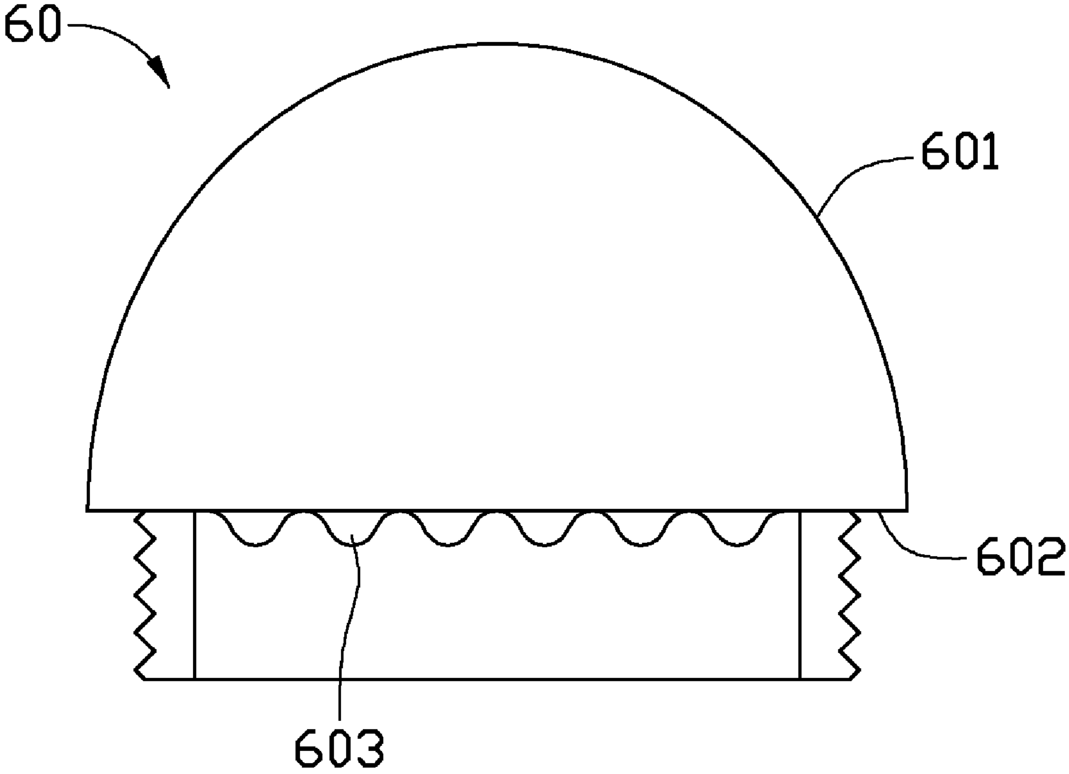
FIG. 6 is a schematic cross-section of a fourth removable cover of the lamp of FIG. 3.

Referring to FIG. 6, the removable cover 60 includes a light emitting surface 601 and a light incident surface 602. The light emitting surface 601 is non-spherical. A plurality of sawtooth protrusions 603 are configured on the light incident surface 602. The light transmits from the sawtooth protrusions 603 to generate uniform brightness. Furthermore, the light passing through the non-spherical profile of the light emitting surface 601 and the sawtooth protrusions 603 provides a wing-shaped distribution curve.

Figure 7:
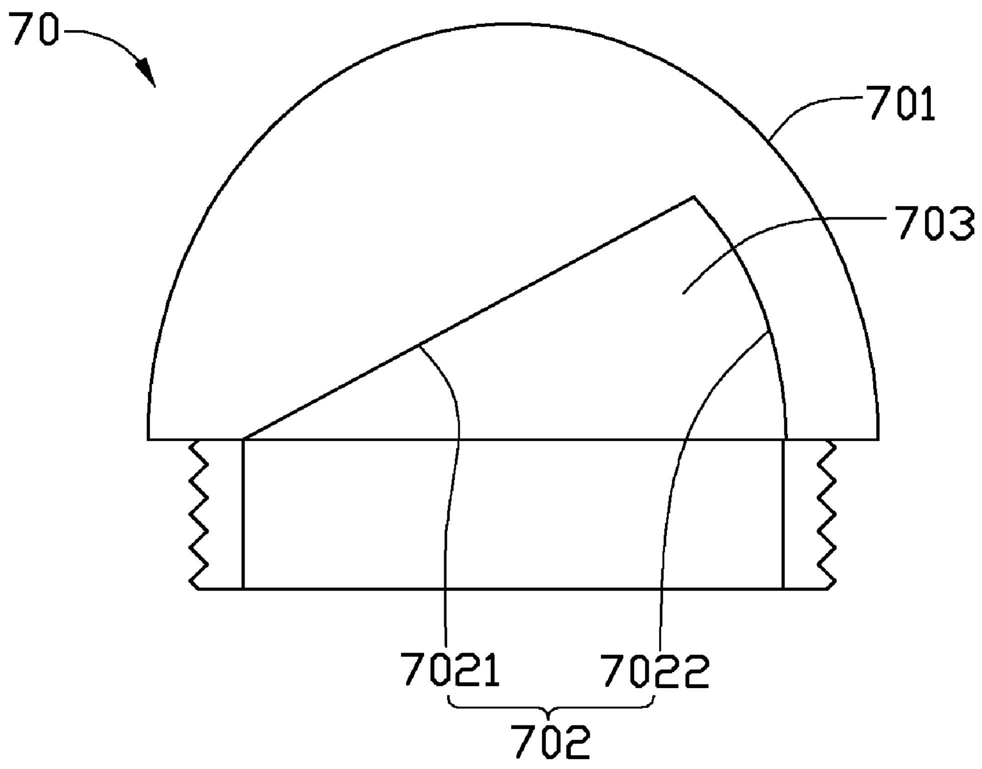
FIG. 7 is a schematic cross-section of a fifth removable cover of the lamp of FIG. 3.

Referring to FIG. 7, a removable cover 70 includes a light emitting surface 701 and a light incident surface 702. The light emitting surface 701 is non-spherical. The light incident surface 702 is recessed toward the light emitting surface 701 forming a cavity 703. The bottom of the cavity 703 includes an inclined surface 7021 arranged obliquely relatively to the printed circuit board 212 of FIG. 3 and a curved surface 7022 connecting to the inclined surface 7021.

Figure 8:
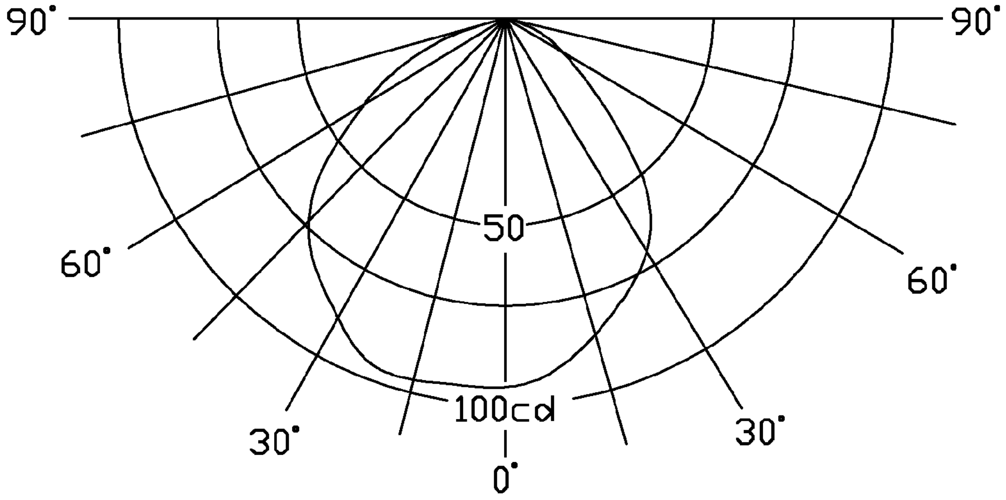
FIG. 8 shows a luminosity of the fifth removable cover of the lamp of FIG. 7.

The light passes through the inclined surface 7021 to generate nonsymmetrical luminosity as shown in FIG. 8. It is understandable that luminosity can be changed according to the corresponding related position of the curved surface 7022 and the inclined surface 7021.

Figure 9:
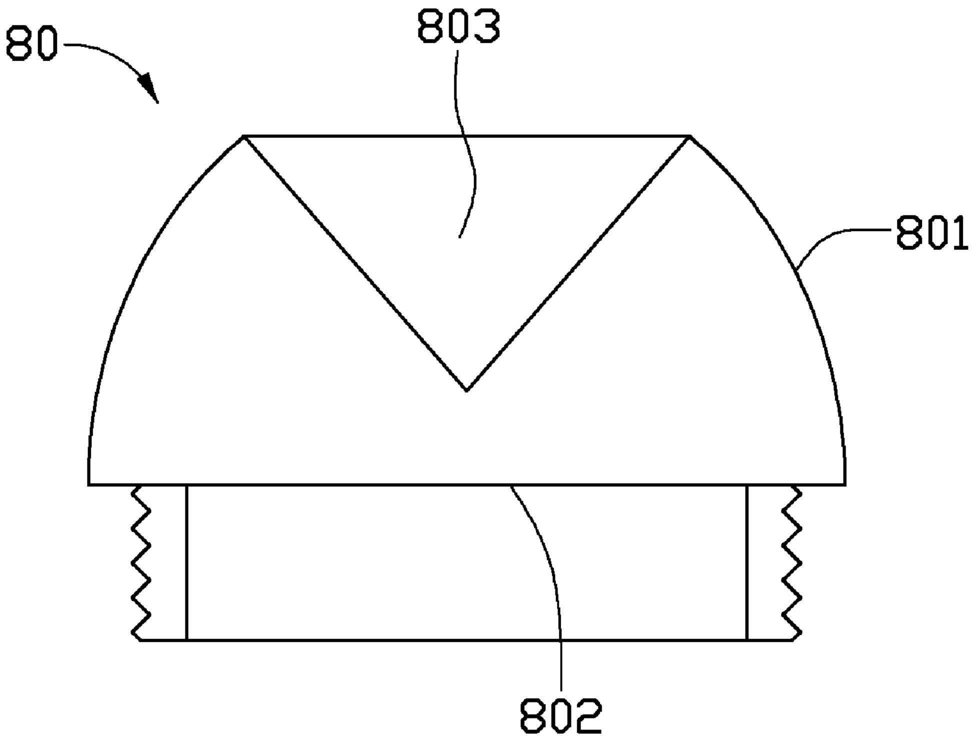
FIG. 9 is a schematic cross-section of a sixth removable cover of the lamp of FIG. 3.

As shown in FIG. 9, a removable cover 80 includes a light emitting surface 801 and a light incident surface 802. The light emitting surface 801 is non-spherical which defines a funnel-shaped cavity 803 on the top. When assembling the removable cover 80 to the main body 21 of FIG. 3, the at least one light emitting element 213 emits light to generate a wing-shaped distribution curve.

Figure 10:
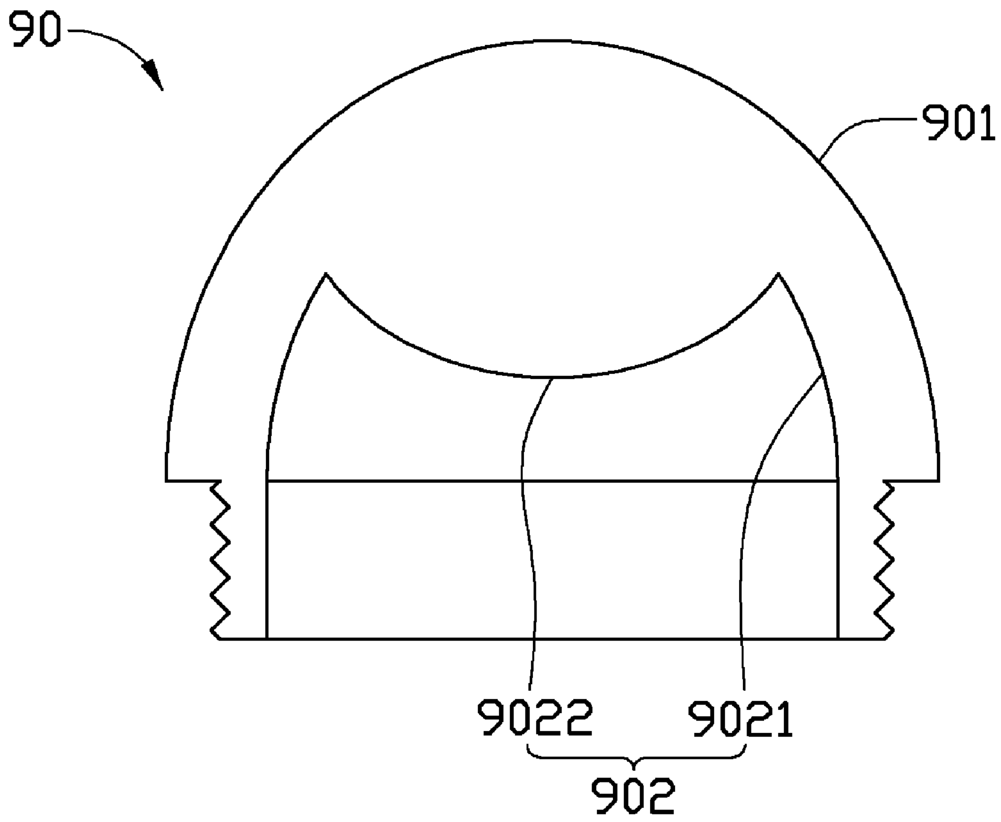
FIG. 10 is a schematic cross-section of a seventh removable cover of the lamp of FIG. 3.

Referring to FIG. 10, a removable cover 90 includes a light emitting surface 901 and a light incident surface 902. The light emitting surface 901 hemispherical. The light incident surface 902 includes a convex surface 9022 and a curved surface 9021 connected to the convex surface 9022. The convex surface 9022 faces the at least one light emitting element 213 of FIG. 3 and is configured for collecting light to transmit through the convex surface 9022 and the curved surface 9021.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lamp, comprising: a main body and a removable cover, the main body including a lamp housing, a printed circuit board (PCB), at least one light emitting element, and a threaded base, wherein the lamp housing defines a socket at an end thereof, the socket receiving the PCB and the at least one light emitting element therein, wherein the PCB is electrically connected to the at least one light emitting element and fixed in the socket, the threaded base is connected to an opposite end of the lamp housing opposite to the end of the socket, and the removable cover covers the at least one light emitting element in the socket of the lamp housing, wherein the removable cover includes a light-transmission portion and a connection portion, the connection portion removably connected to the end of the lamp housing comprising the socket by a threaded engagement between the connection portion and the end of the lamp housing comprising the socket, and the light-transmission portion is opposite to the socket.

2. The lamp of claim 1, wherein the light-transmission portion of the removable cover comprises a light incident surface adjacent to the at least one light emitting element and a light emitting surface opposite to the light incident surface, and the connection portion connects to the light incident surface of the light-transmission portion.

3. The lamp of claim 2, wherein the light-transmission portion of the removable cover is defined with at least one through hole passing through the light emitting surface and the light incident surface.

4. The lamp of claim 2, wherein the light incident surface comprises a socket which is recessed toward the light emitting surface.

5. The lamp of claim 4, wherein the bottom of the socket includes an inclined surface arranged obliquely relatively to the printed circuit board and a curved surface connecting to the inclined surface.

6. The lamp of claim 4, wherein the light incidence surface of the removable cover comprises a convex surface and a curved surface connecting to the convex surface.

7. The lamp of claim 2, wherein the light incident surface comprises a plurality of trapezoidal sawtooth protrusions optically coupled to the at least one light emitting element.

8. The lamp of claim 2, wherein the light emitting surface or the light incident surface comprises a sawtooth protrusion.

9. The lamp of claim 2, wherein the light emitting surface of the removable cover comprises a funnel-shaped cavity.

10. The lamp of claim 1, wherein the light incident surface of the removable cover is coated with a luminescent layer.

11. The lamp of claim 1, wherein the removable cover is epoxy resin, silicone, polymer, polyester or acrylic resin.

* * * * *